United States Patent
Schnattinger et al.

(10) Patent No.: US 10,838,004 B2
(45) Date of Patent: Nov. 17, 2020

(54) TEST ARRANGEMENT AND TEST METHOD

(71) Applicant: Rohde & Schwarz GmbH & Co. KG, München (DE)

(72) Inventors: Georg Schnattinger, München (DE); Werner Perndl, Zorneding (DE); Michael Katzer, München (DE); Korbinian Pfaffeneder, Munich (DE); Thomas Braunstorfinger, München (DE); Marcel Thraenhardt, Freising (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 415 days.

(21) Appl. No.: 15/687,820

(22) Filed: Aug. 28, 2017

(65) Prior Publication Data
US 2019/0064262 A1 Feb. 28, 2019

(51) Int. Cl.
*G01R 27/06* (2006.01)
*G01R 31/302* (2006.01)
*G01R 29/10* (2006.01)

(52) U.S. Cl.
CPC ....... *G01R 31/3025* (2013.01); *G01R 29/105* (2013.01)

(58) Field of Classification Search
CPC ........ G01R 27/06; G01R 33/46; G01R 33/48; G01R 33/60; G01R 31/3025; G01R 29/105
(Continued)

(56) References Cited

U.S. PATENT DOCUMENTS 5,311,440 A * 5/1994 Hess, Jr. ............... G01R 29/10
  324/612
6,329,953 B1 * 12/2001 McKivergan .......... G01R 29/10
  343/703
(Continued)

FOREIGN PATENT DOCUMENTS

CN 104764938 A 7/2015
CN 206096272 U 4/2017
(Continued)

OTHER PUBLICATIONS

"Antenna Array Testing—Conducted and Over the Air: The Way to 5G," Rohde & Schwarz: White Paper, Retrieved from: https://www.rohde-schwarz.com/us/applications/antenna-array-testing-conducted-and-over-the-air-the-way-to-5g-white-paper_230854-353344.html, Mar. 20, 2017, 30 pp.

*Primary Examiner* — Jermele M Hollington
*Assistant Examiner* — Taqi R Nasir
(74) *Attorney, Agent, or Firm* — Shumaker & Sieffert, P.A.

(57) ABSTRACT

Summarizing, the present invention relates to a test arrangement in the test method for acquiring test data in the surrounding of a device under test. At least two measurement devices are arranged in the surrounding of the device under test, wherein the two measurement devices are communicatively coupled for phase locking. At least one of the measurement devices can be moved around the device under test for acquiring measurement data, wherein the measurement devices comprise a measurement antenna and the vectorial measurement receiver. Accordingly, during the measurements, the at least one vectorial measurement receiver is moved around together with the measurement antenna, wherein the spatial relationship between the mea-
(Continued)

surement antenna and the vectorial measurement receiver is remained constant during the movement.

20 Claims, 4 Drawing Sheets

(58) Field of Classification Search
USPC ....... 324/754.31, 76.14, 313, 314, 329, 332, 324/637, 639, 136, 750.15
See application file for complete search history.

(56) References Cited

U.S. PATENT DOCUMENTS

| | | | |
|---|---|---|---|
| 8,269,195 B2* | 9/2012 | Rigney | A61N 5/107 250/492.3 |
| 2005/0156779 A1* | 7/2005 | Wixforth | G01S 7/288 342/70 |
| 2012/0306681 A1* | 12/2012 | Elad | G01V 8/005 342/27 |
| 2014/0256373 A1* | 9/2014 | Hernandez | H04B 17/27 455/509 |

FOREIGN PATENT DOCUMENTS

| | | |
|---|---|---|
| DE | 10043461 A1 | 3/2002 |
| EP | 3051304 A1 | 8/2016 |

* cited by examiner

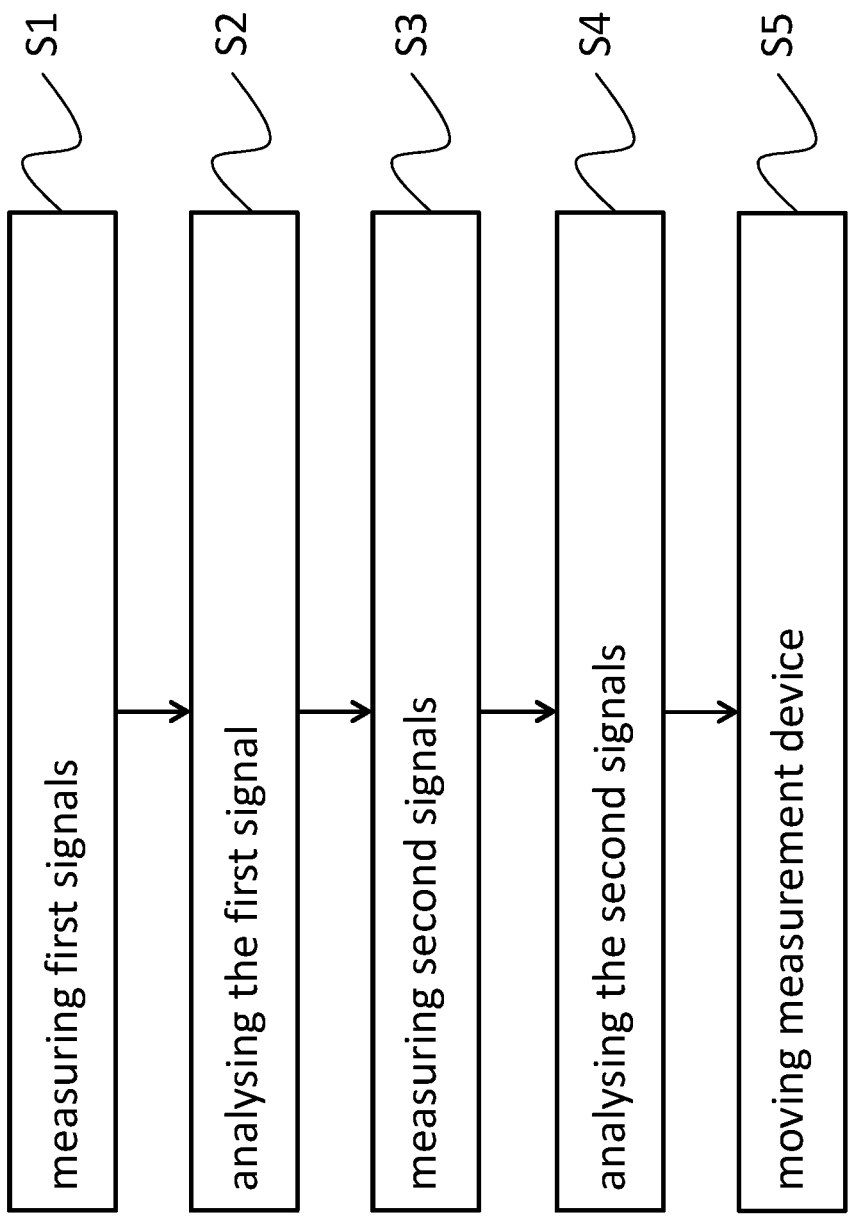

TEST ARRANGEMENT AND TEST METHOD

TECHNICAL FIELD

The present invention relates to a test arrangement. The present invention further relates to a test method.

BACKGROUND

Although applicable in principle to any wireless test system, the present invention and its underlying problem will be hereinafter described in combination with testing of wireless devices.

The use of wireless communication systems for communication between electronic device increases continually with the advance of high-speed wireless data communications.

During development or production of devices for such communication systems it is necessary to thoroughly test the devices and analyse the radio frequency properties of the device. In particular, it is desirable to measure the near-field properties of an antenna included in the device.

However, measurement of near-filed properties requires a vectorial analysis of complex near-field-data comprising amplitude and phase. The devices for a vectorial analysis of the near-field data usually are very complex and require large assembly space. Consequently, the devices for the vectorial analysis have to remain on a fixed position, while the measurement antennas for scanning the surrounding of the device under test move around. Thus, a cable connection is required between the measurement antennas and the devices for the vectorial analysis.

SUMMARY

Against this background, there is the need to provide a simple test equipment for measuring near-field characteristics of devices under test such as of an antennas.

The present invention solves this problem with a test arrangement with the features of claim 1 and by a test method with the features of claim 10.

Accordingly it is provided:

According to a first aspect, a test arrangement for testing a device under test is provided. The test arrangement comprises a first measurement device comprising a first measurement antenna for measuring first signals emitted by the device under test and a first vectorial measurement receiver for vectorially analysing the measured first signals. The test arrangement further comprises a second measurement device comprising a second measurement antenna for measuring second signals emitted by the device under test and a second vectorial measurement receiver for vectorially analysing the measured second signals. The second measurement device is communicatively coupled to the first measurement device for exchanging phase information or phase synchronisation or phase locking. Further, the test arrangement comprises a mechanical positioning structure that carries the first measurement device and controllably moves the first measurement antenna together with the first vectorial measurement receiver of the first measurement device around the device under test.

According to a second aspect, a test method for testing a device under test is provided. The test method comprises the steps of measuring, by a first measurement antenna, first signals emitted by the device under test; vectorially analysing the measured first signals by a first vectorial measurement receiver; measuring, by a second measurement antenna, second signals emitted by the device under test; vectorially analysing the measured second signals by a second vectorial measurement receiver, wherein the vectorial measurement receiver is communicatively coupled to the first vectorial measurement receiver for exchanging phase information or phase synchronisation or phase locking; and controllably moving the first measurement antenna together with the first vectorial measurement receiver around the device under test by a mechanical position structure.

The present invention is based on the fact that the determination of near-field-characteristics of a device under test requires a vectorial analysis of complex near-field-measurements comprising amplitude and phase. As explained above, the vectorial analysis of complex data requires a huge and heavy-weighted vector analysing device. As a consequence, such vector analysing devices usually are located at a fixed position while the device under test.

However, measuring the characteristics of a device under test requires measuring signals emitted by the device under test at different positions in the spatial surrounding of the device under test. For this purpose, the signals emitted by the device under test are measured by measurement antennas and the measured signals are usually provided to a vector analysing devices by means of a cable connection.

The present invention however avoids such cable connections between the measurement antenna and the vector analysing devices. It is therefore an idea of the present invention to combine the measurement antenna and a related vectorial measurement receiver, and to move both components together when scanning the electrical field in surrounding of a device under test.

However, for such a configuration when the vectorial measurement receiver is moved together with the corresponding measurement antenna, it is necessary to reduce the volume and the weight of the vectorial measurement receiver. Hence, moving the combination of measurement antenna and vectorial measurement receiver is only possible with simplified vector analysing receivers which fulfil the above mentioned requirements. Therefore, the present invention provides an arrangement of a measurement antenna and an electrically connected analysing a device with a weight and a spatial volume which can be easily moved during a measurement process which scans the electrical field in the surrounding of the device under test.

The vectorial measurement receiver receives the measured signals from the measurement antenna and performed an analysis in order to determine characteristic values of the electrical field in the surrounding of the device under test. For this purpose, the vectorial measurement receiver may take into account the phase and the amplitude of the measured signal which is measured by the related measurement antenna.

In order to analyse the space of the measured signals, the phase of the measured signal has to be analysed with respect to a reference phase. In some cases, it might be possible to refer to a phase of the signal which is provided to the device under test. However, in many measurement scenarios the device under test is not directly available or the signal which is provided to the device under test is not available for other reasons. In these cases, a reference for the analysis of the phase has to be determined otherwise. For example, the phase of the measured signal measured may be analysed this reference to a phase of signal measured by a further measurement antenna. For this purpose, the analysing receiver connected to the respective measurement antenna of it may be connected with each other in order to lock the respective phases. For example, the related vectorial measurement receiver may communicatively or electrical connected with each other in order to provide a signal or other information for synchronising the phases of the vectorial measurement receivers. In this way, it is possible to analyse the phases of the measured signals in the surrounding of a device under test, even if the antenna of the device under test or the signals provided to the antenna of the device under test are not directly available.

For example, one measurement antenna may be located at a fixed position in the spatial surrounding of the device under test, while at least one further measurement antenna— and the related vectorial measurement receiver—are moved around in the spatial surrounding of the device under test. In this way, the phases of the measured signal obtained by the moving measurement antenna can be compared with the phase of the signal measured by the fixed measurement antenna. However, any other arrangement, for example an arrangement with two moving measurement antennas, may be possible, too.

By combining the measurement antenna and the related vectorial measurement receiver, and moving both components when scanning the electrical field in the spatial surrounding of the device under test, a reliable measurement of the electrical field in the surrounding of the device under testing can be achieved. In particular, it is no longer necessary to use a cable connection between the measurement antenna and the vectorial measurement receiver. Accordingly, the problems arising with such a cable connection can be avoided. For instance, an attenuation of the related cables and the additionally required connectors can be minimised. Failures are due to a broken cable connection or a faulty connector can be avoided. In this way, the availability of the measurement equipment can be increased and the reliability of the measurement is enhanced.

It is understood, that the scanning of the electrical field in the surrounding of the device under test is not limited to only a pair of two measurement antennas and to related vectorial measurement receivers. Moreover, it is also possible to scan the electrical field in the surrounding of the device under test by more than two measurement antennas and related vectorial measurement receivers. Thus, the test arrangement according to the present invention may be performed with a number of one or more first measurement devices which are moved around in the surrounding of the device under test.

The vectorial measurement receiver which is used for analysing the measurement signals measured by the respective measurement antenna may be any kind of analysing receiver which can perform an analysis of the measured signals to obtain the desired characteristic data of the electromagnetic field in the surrounding of the device under test. For example, the vectorial measurement receiver may be vector analyser having reduced spatial volume and/or weight. In particular it may be even possible to use enhanced vectorial power sensors, such as Rhode & Schwarz NRP-Z power sensors.

The test equipment may further comprise a measurement controller for controlling the operation of the measurement procedure. For example, the measurement controller may be communicatively coupled with the mechanical positioning structure in order to move the measurement antenna and the vectorial measurement receiver. For example, the measurement controller may send commands to the mechanical positioning structure in order to cause the mechanical positioning structure to move in a desired direction or to a desired position. The measurement controller may refer to predetermined movement sequences in order to cover a desired measurement plane for measuring the electromagnetic field in the surrounding of the device under test. For this purpose, the predetermined movement sequences may be stored in a memory of the measurement controller. It is understood, that the movement sequences for moving the measurement antenna and the vectorial measurement receiver may be also determined by any other manner. For example, the measurement controller may compute an appropriate movement sequence for moving the measurement antenna and the vectorial measurement receiver. For example, the movement sequences may be computed for each measurement procedure individually. Alternatively, an already computed movement sequence may be also stored in a memory of the measurement controller and may be read out for other measurements in the future.

The measurement controller may receive data from the vectorial measurement receivers and further analyse the received data. For example, the measurement controller may receive the data from the vectorial measurement receivers for each position of the measurement antenna and correlate the received data with information about the position on which the respective data are acquired by the measurement antenna and the vectorial measurement receiver. Accordingly, the measurement controller can combine all the received data to generate a map of the electromagnetic field in the surrounding of the device under test. It is understood, that the measurement receiver may also analyse the received data in order to generate any other kind of measurement result.

As mentioned above, the measurement antenna and the related vectorial measurement receiver may be arranged together on a mechanical positioning structure. The mechanical positioning structure may e.g. comprise a guide or rail and a slide that carries the measurement antenna and the respective vectorial measurement receiver. The mechanical positioning structure may also comprise a slide with wheels or simply be a mechanical holding device that is not fixed to the ground and may therefore be carried into the required position.

The measurement antennas may be any type of antenna that is adequate to perform the required measurements. Such a test antenna may e.g. be a microstrip antenna or a horn antenna and may be adapted in size according to the relevant signal frequencies or wavelengths.

The measurement antenna may comprise a signal connector for connecting the measurement antenna to the vectorial measurement receiver or and may be directly coupled with the vectorial measurement receiver.

Further embodiments of the present invention are subject of the further subclaims and of the following description, referring to the drawings.

In a possible embodiment, the device under test comprises a plurality of antennas under test.

In particular, the device under test may comprise any number of antennas under test, i.e. one or more than one antennas under test, which may emit wireless signals. The antenna under test may be any kind of antenna. In particular, the antenna under test may be an antenna which is already integrated in a device, for instance a device for mobile communication. For example, the antenna may be an antenna of base station for mobile communication network, in particular an antenna of an antenna arrangement of a 5G base station, an antenna of a mobile or cellular phone, an antenna integrated in an Internet of Things (IoT) device. However, it is understood, that the device under test is not limited to the before mentioned devices. Moreover, the test arrangement may be used for measuring characteristic antenna properties of any kind of antenna.

The antenna under test may be any kind of antenna. In particular, the antenna under test may be an antenna which is already integrated in a device, for instance a device for mobile communication. For example, the antenna may be an antenna of base station for mobile communication network, in particular an antenna of an antenna arrangement of a 5G base station, an antenna of a mobile or cellular phone, an antenna integrated in an Internet of Things (IoT) device. However, it is understood, that the device under test is not limited to the before mentioned devices. Moreover, the test arrangement may be used for measuring characteristic antenna properties of any kind of antenna.

In a possible embodiment of the test arrangement, the spatial alignment between the first measurement antenna and the first vectorial measurement receiver of the first measurement device remains constant when the first measurement device is moved by the mechanical positioning structure.

As already mentioned above, the first measurement antenna is moved together with the first vectorial measurement receiver. By ensuring that the relative position of the vectorial measurement receiver with respect to the measurement antenna remains unchanged, it can be ensured that the signal path between the measurement antenna and the vectorial measurement receiver also does not change. Accordingly, disturbances or attenuation due to twisting or bending of the electrical connection between the measurement antenna and the vectorial measurement receiver can be avoided.

The measurement antenna and the vectorial measurement receiver may be arranged on a common platform. For example such common platform may be any kind of carrier which can carry the measurement antenna together with the respective vectorial measurement receiver.

In a possible embodiment, the first measurement antenna is directly connected to the first vectorial measurement receiver of the first measurement device.

For a direct connection between the measurement antenna and the respective vectorial measurement receiver, there is no additional connector element in the signal path between the measurement antenna and the vectorial measurement receiver. For example, an output port of the measurement antenna may be connected to an input port of the vectorial measurement receiver by a soldered connection, a welded connection or a screw connection. Alternatively, the output port of the measurement antenna may comprise a connector which is directly connected to the connector of the input port of the vectorial measurement receiver. However, it is understood that a direct connection between the measurement antenna and the vectorial measurement receiver means that no additional cable is arranged between the measurement antenna and the vectorial measurement receiver.

For such a direct connection between the measurement antenna and the vectorial measurement receiver, an output port of the measurement antenna may be directly connected to an input component of the vectorial measurement receiver. For example, the measurement antenna may be directly connected to a mixer, an analogue-to-digital converter, or any other component at the input of the vectorial measurement receiver.

In a possible embodiment, the first measurement antenna and the first vectorial measurement receiver of the first measurement device are arranged on a same printed circuit board.

By using a common printed circuit board or another common carrier for the measurement antenna and the related vectorial measurement receiver, a very short and reliable signal path between the measurement antenna and the receiver can be achieved. In particular, by arranging the measurement antenna and the vectorial measurement receiver on a common structure such as the common printed circuit board, the size of the respective measurement device can be minimised. For example, the measurement antenna on the printed circuit board may be realised by a conducting structure on the printed circuit board which is electrically connected to the input elements of the vectorial measurement receiver, for instance to a mixer or to an analogue-to-digital converter.

In a possible embodiment, the test arrangement comprises a further mechanical positioning structure that carries the second measurement device and controllably moves the second measurement antenna and the second vectorial measurement receiver of the second measurement device around the device under test.

The further mechanical positioning structure for carrying the second measurement device may be configured similar to the mechanical positioning structure for carrying the first measurement device. Hence, the explanation for the mechanical positioning structure of the first measurement device applies also for the further mechanical positioning structure.

In a possible embodiment, the mechanical positioning structure moves the first measurement device around the device under test on a predetermined measurement area.

By moving the first measurement device around the device under test, the electromagnetic field in the respective measurement area can be scanned and characterising parameters of the electromagnetic field in the surrounding of the device under test can be determined. Accordingly, by a scanning the electromagnetic field, it is possible to analyse the electromagnetic field and to determine the characterising parameters by means of only two measurement devices.

However, it is understood that the scanning of the electromagnetic field in the spatial surrounding of the device under test may be also performed by more than one first measurement device. Accordingly, any number of one or more first measurement devices may be used for scanning the electromagnetic field in the surrounding of the device under test.

In particular, the first measurement device may be moved along an appropriate area, for which the characterising data of the device under test shall be determined. For example, the predetermined area may comprise a circular circumference or a spherical circumference. It is understood, that depending on the measurement requirements only a segment of the circular or spherical circumference may be taken into account. For example, the measurement plane may be limited to the area of the main lobe of an antenna in the device under test.

In a possible embodiment, the second measurement device is located at a predetermined position. Especially, the second measurement device may be located outside the predetermined measurement area.

By locating the second measurement device at the fixed predetermined position while moving the first measurement device, the measurement of the first measurement device provides a reliable and constant basis for phase locking. In particular, a reference signal provided by the second measurement device may be used as a reference for analysing the phases and/or amplitudes by the first measurement device.

It is understood, that the first measurement device cannot move to the position of the second measurement device, since it is not possible that two measurement devices are located at the same position. Accordingly, when scanning a desired predetermined measurement area, the second measurement device may be located at a position outside the desired measurement area. In this way, the first measurement device can be moved through the desired measurement area and scan the electromagnetic field in the whole measurement area without the risk of a collision between the first and the second measurement device.

For example, the second measurement device may be located at the position which is covered by a side lobe of an antenna in the device under test. Accordingly, the first measurement device can scan the whole area of the main lobe without any conflicts with the second measurement device.

However, it is understood that the position of the second measurement device may be also changed while scanning the electromagnetic field in the surrounding of the device under test.

In a possible embodiment, the first measurement device and the second measurement device are arranged in a near-field distance of the device under test.

The boundary between the near-field region and the far-field region is only vaguely defined, and it depends on the dominant wavelength (A) emitted by the respective antenna.

The far-field region of an antenna can be assumed to hold for distances greater than $2d2/\lambda$. In this case d is the diameter of a minimum sphere enclosing the active surface, e.g. the antenna, completely.

In a possible embodiment, the measurement arrangement comprises a transformation processor that is coupled to the first measurement device and the second measurement device. The transformation processor may perform a near-field to far-field transformation based on the signals received from the device under test and outputs respective transformed signals.

Accordingly, it is possible to determine characterising parameters of the device under test for far-field conditions by measuring the device under test in near-field conditions. In this way, the required space for measuring the properties of the device under test can be significantly reduced.

It is understood, that the near-field to far-field transformation may be subjected to any kind of characterising properties of the device under test. In particular, the respective transformation may be used to determine the far-field performance, gain, radiation pattern or any other characterising property of the device under test.

The transformation processor may comprise first instructions that cause the transformation processor to perform the near-field to far-field transformation of the received signals.

The transformation processor may comprise hardware elements, like e.g. a processing unit. However, the transformation processor may also be software implemented at least in part. The first instructions may therefore be stored in a memory that is coupled to a general purpose processor, e.g. via a memory bus. The processor may further execute an operating system that loads and executes the first instructions. The processor may e.g. be an Intel processor that runs a Windows or Linux operating system that loads and executes the first instructions. In another embodiment, the processor may be a processor of a measurement device that may e.g. run an embedded operating system that loads and executes the first instructions.

In a possible embodiment, the measurement controller may comprise second instructions that cause the measurement controller to control the measurement procedure for moving the measurement antenna and the vectorial measurement receiver, for controlling the other related devices and for computing the measurement results are based on the output data of the v measurement receiver.

The measurement controller may comprise hardware elements, like e.g. a processing unit. However, the measurement controller may also be software implemented at least in part. The second instructions may therefore be stored in a memory that is coupled to a general purpose processor, e.g. via a memory bus. The processor may further execute an operating system that loads and executes the second instructions. The processor may e.g. be an Intel processor that runs a Windows or Linux operating system that loads and executes the second instructions. In another embodiment, the processor may be a processor of a measurement device that may e.g. run an embedded operating system that loads and executes the second instructions.

It is understood, that a single computer or processor may load and execute the first instructions and the second instructions.

In a possible embodiment, the test arrangement may comprise a measurement chamber that may accommodate the first measurement device, the second measurement device, the mechanical positioning structure, the mechanical position structure and the device under test.

The measurement chamber may comprise a shielding or protective housing that isolates the test arrangement from any outside interference or disturbance during the measurements. It is understood that the measurement chamber may e.g. also comprise a door or sealable opening for accessing the insides of the measurement chamber, e.g. to place the device under test in the measurement chamber.

In a possible embodiment, the measurement chamber may comprise an anechoic chamber.

An anechoic chamber is a measurement chamber that is designed to completely absorb reflections of electromagnetic waves. The interior surfaces of the anechoic chamber may be covered with radiation absorbent material, RAM. RAM is designed and shaped to absorb incident RF radiation as effectively as possible. Measurements in electromagnetic compatibility and antenna radiation patterns require that signals arising from the test setup, like e.g. reflections, are negligible to avoid the risk of causing measurement errors and ambiguities.

With the anechoic chamber the quality of the measurements performed with the test arrangement may therefore be increased.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which:

FIG. 4 shows a flow diagram of an embodiment of a test method according to the present invention.

Figure 1:
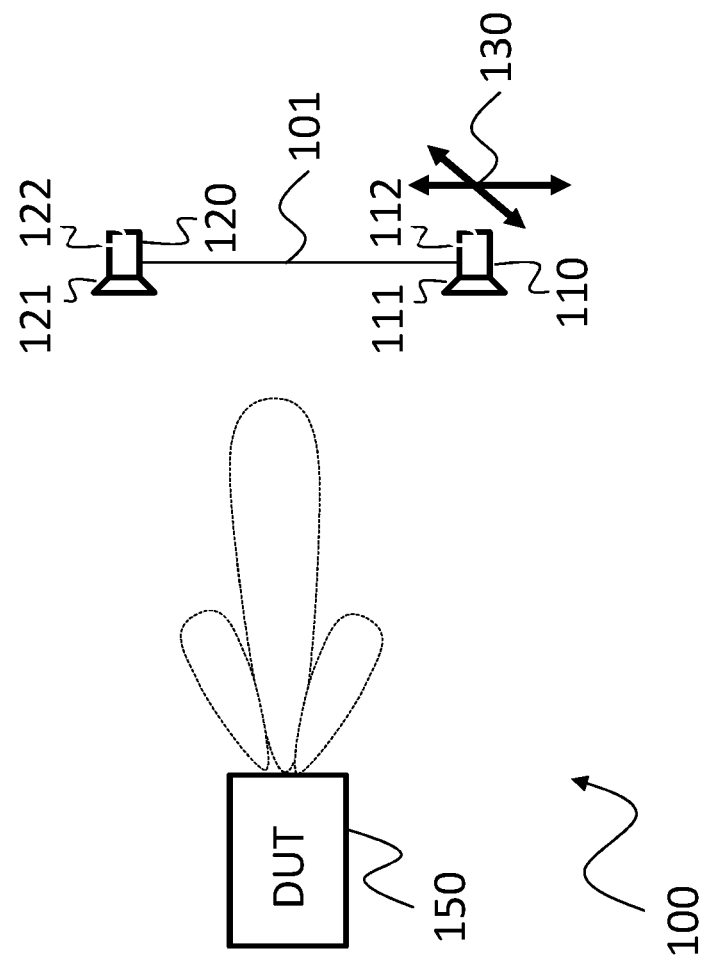
FIG. 1 shows a block diagram of an embodiment of a test arrangement according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

FIG. 1 shows a block diagram of an embodiment of a test arrangement 100. The test arrangement 100 comprises the first measurement device 110 with a first measurement antenna 111 and a first vectorial measurement receiver 112. The test arrangement further comprises a second measurement device 120 with a second measurement antenna 121 and second vectorial measurement receiver 122. The first measurement device 110 and the second measurement device 120 are communicatively coupled with each other via a communication link 101. This communication link may be used for exchanging phase information, synchronising the phases of the first vectorial measurement receiver 111 and the second vectorial measurement receiver 122 or to lock the phases of the first vectorial measurement receiver 112 and the second vectorial measurement receiver 122. The first measurement device 110 is arranged on the mechanical positioning structure 130.

Even though only a single first measurement device 110 and only a single second measurement device 120 are illustrated in FIG. 1, it is understood that the measurement arrangement 100 may comprise more than one first measurement device 110 and/or more than one second measurement device 120. In other words, any number of one or more first measurement devices 110 or second measurement devices 120 may be used in the test arrangement 100.

If more than one first measurement device 110 is used in the test arrangement 100, a separate mechanical positioning structure 130 may be used for each first measurement device 110. However, it is also possible to arrange a plurality of first measurement devices 110 on a common holding structure. Accordingly, the plurality of first measurement devices 110 can be moved around by a single mechanical positioning structure 130. In this case, the individual first measurement devices 110 may have a well-known spatial relationship to each other. This known spatial relationship of the individual first measurement devices 110 may be taken into account when determining the positions of the individual first measurement devices 110.

However, it is understood, that the mechanical positioning structure 130 may also move a plurality of first measurement devices 110 individually. For example, the mechanical positioning structure 130 may provide a plurality of holding elements, each for the first measurement device 110. In this case, each holding element may be moved independently to move the corresponding first measurement devices 110.

The first measurement antenna 111 and the second measurement antenna 121 receive wireless signals from the device under test 150. It is understood, that although not shown, the first measurement antenna 111 and/or the second measurement antenna 121 may also transmit wireless signals to the device under test 150. Respective signal generators may be provided and connected to the first measurement antenna 111 or the second measurement antenna 121. The device under test 150 may then forward the received signal from the first measurement antenna 111 or the second measurement antenna 122 to an electrically connected device (not shown).

The second measurement device 110 may be positioned at the predetermined position in the surrounding of the device under test 150. Even though the position of the second measurement device 120 may be chosen almost arbitrary, it is understood that the second measurement antenna 121 of the measurement device 120 may be located at the position covered by the main lobe or side lobe of an antenna in the device under test 150. For example, the second measurement device 120 with the second measurement antenna 121 may be located at a position covered by side lobe of the antenna in the device under test 150. In this way the second measurement device 120 does not hamper the first measurement device 110 when the first measurement device 110 is scanning the area covered by the main lobe of the device under test 150.

As already mentioned above, the first measurement device 110 is mechanically connected to the mechanical positioning structure 130. Accordingly, the first measurement device 110 can be moved around by means of the mechanical positioning structure 130.

The mechanical positioning structure 130 moves the first measurement device 110 around the device under test 150 on a predetermined plane. Depending on the measurement configuration, the predetermined plane may be flat rectangular or square plane. However, in order to cover an extended area in the surrounding of the device under test 150, the mechanical positioning structure 130 may move the first measurement device 110 around the device under test 150 on circle or a circular circumference. It is understood, that the test arrangement 100 is shown in schematic view and that the movement of the first measurement device 110 is also shown only in the schematic manner. It is further understood, that the mechanical positioning structure 130 may also move the first measurement device 110 on a spherical circumference, i.e. a three-dimensional circumference, or another three-dimensional plane.

Although not explicitly shown, it is understood, that the mechanical positioning structure 130 may e.g. comprise a guide structure, for example, a circular guide. The measurement device 110 may e.g. be mounted on a slide that moves on the guide. For a movement on a desired plane, the guide may be rotatably mounted, e.g. similar to a gimbal.

As already mentioned above, the first measurement device 110 comprises a first measurement antenna 111 and a first vectorial measurement receiver 112. Accordingly, the mechanically positioning structure 130 moves both, the first measurement antenna 111 and the first vectorial measurement receiver 112.

The first measurement antenna 111 and the first vectorial measurement receiver 112 may be directly connected with each other. In this connection, the term "directly connected" means that the output of the measurement antenna 111 is connected to the vectorial measurement receiver 112 without an additional cable or another element for bridging a distance between the measurement antenna 111 and the vectorial measurement receiver 112. The direct connection between the measurement antenna 111 and the vectorial measurement receiver 112 may be realised by connecting an output port of the measurement antenna 111 to an input port of the vectorial measurement receiver 112. For example, a connector at the output port of the measurement antenna 111 may be connected to a connector of the input port of the vectorial measurement receiver 112 without any additional elements.

It is understood, that the measurement antenna 111 may be also connected to the vectorial measurement receiver 112 without any connectors. For instance, the measurement antenna 111 may be connected to the vectorial measurement receiver 112 by a soldered connection, a welded connection or a screwed connection. However, any other method for directly connecting the measurement antenna 111 to the measurement receiver 112 may be possible, too.

Further, it is also possible to arrange the measurement antenna 111 and the vectorial measurement receiver 112 on a common structure, for instance a common printed circuit board. Accordingly, no additional elements are required for connecting the measurement antenna 111 and the vectorial measurement receiver 112. It is understood, that besides a common printed circuit board, any other common structure for building up the measurement antenna 111 together with the vectorial measurement receiver 112 may be possible, too.

Due to the direct connection between the first measurement antenna 111 and the first vectorial measurement receiver 112, these components of the first measurement device 110 form a common structure. Accordingly, when moving around the first measurement device 110 by means of the mechanical positioning structure 130, the relative position of the first measurement antenna 111 with respect to the first vectorial measurement receiver 112 does not change.

As already mentioned above, the first measurement device 110 is a communicatively coupled with the second measurement device 120. For example, the first vectorial measurement receiver 112 may comprise a communication terminal which is connected with a communication terminal of the second vectorial measurement receiver 122. In this way, the first vectorial measurement receiver 112 and the second vectorial measurement receiver 122 may communicate with each order. For example, one vectorial measurement receiver 112, 122 may analyse the phase of a measured signal from the device under test 150 and provide information about the phase to the other vectorial measurement receiver 112, 122. The information about the phase of the measured signal may be provided by an analogue signal or by digital data. Accordingly, it is possible to synchronise the analysis of the phases of the first and the second vectorial measurement receivers 112, 122. Thus, the phases of the first and second vectorial measurement receivers 112 and 122 can be locked.

The first and the second vectorial measurement receiver 112, 122 may analyse the signals measured by the first and the second measurement antenna 111, 121. For example, the first vectorial measurement receiver 112 may determine the amplitude and the phase of the signal measured by the first measurement antenna 111. Accordingly, the second vectorial measurement receiver 122 may determine the amplitude and the phase of the signal measured by the second measurement antenna 121. Since the first vectorial measurement receiver 112 and the second vectorial measurement receiver 122 are communicatively coupled with each other, and the phases of the vectorial measurement receivers 112, 122 may be locked, the first vectorial measurement receiver 122 may compare the phase of the signal measured by the first measurement antenna 111 with the phase of the signal which is measured by the second measurement antenna 121. Furthermore, the second vectorial measurement receiver 122 may also compare the phases of the two measured signals.

Based on the analysis of the amplitude of the measured signals and the comparison of the phases of the two measured signals, the first and the second vectorial measurement receivers 112, 122 may determine characteristic parameters of the electromagnetic field in the surrounding of the device under test 150.

By moving at least the first measurement device 110 with the first measurement antenna 111 and the first vectorial measurement receiver 112 along a predetermined curve over a predetermined area, it is possible to acquire a plurality of characteristic parameters of the electromagnetic field generated by the device under test 150. In particular, the acquired characteristic parameters may be correlated with the related position of the first measurement device 110. In this way, a map can be generated by assigning the acquired measurements to the corresponding position of the first measurement device 110. Based on these measurements, it is possible to determine characteristic data for the device under test 150. In particular, the device under test 150 may comprise one or more antennas for emitting wireless signals. In this case it may be possible to determine the characteristics of such an antenna included in the device under test. For example, the acquired measurement may be used for determining a radiation pattern, a gain, a performance or any other characteristic parameter of the antenna in the device under test 150.

Since the test arrangement 100 takes into account the phases of the measured signals, the above described measurement of the device under test 150 may be performed under far-field conditions or under near-field conditions. Accordingly, the measurement of the characteristic near-field-data may be used for any appropriate application. For example, the characteristic near-field-data may be used for evaluating the near-field-properties of the device under test 150. Furthermore, it is also possible to use the near-field-data to transform the data to far-field-data in order to evaluate the far-field-properties of the device under test 150. However, it is understood, that the use of the acquired near-field-data is not limited to the above mentioned applications.

Figure 2:
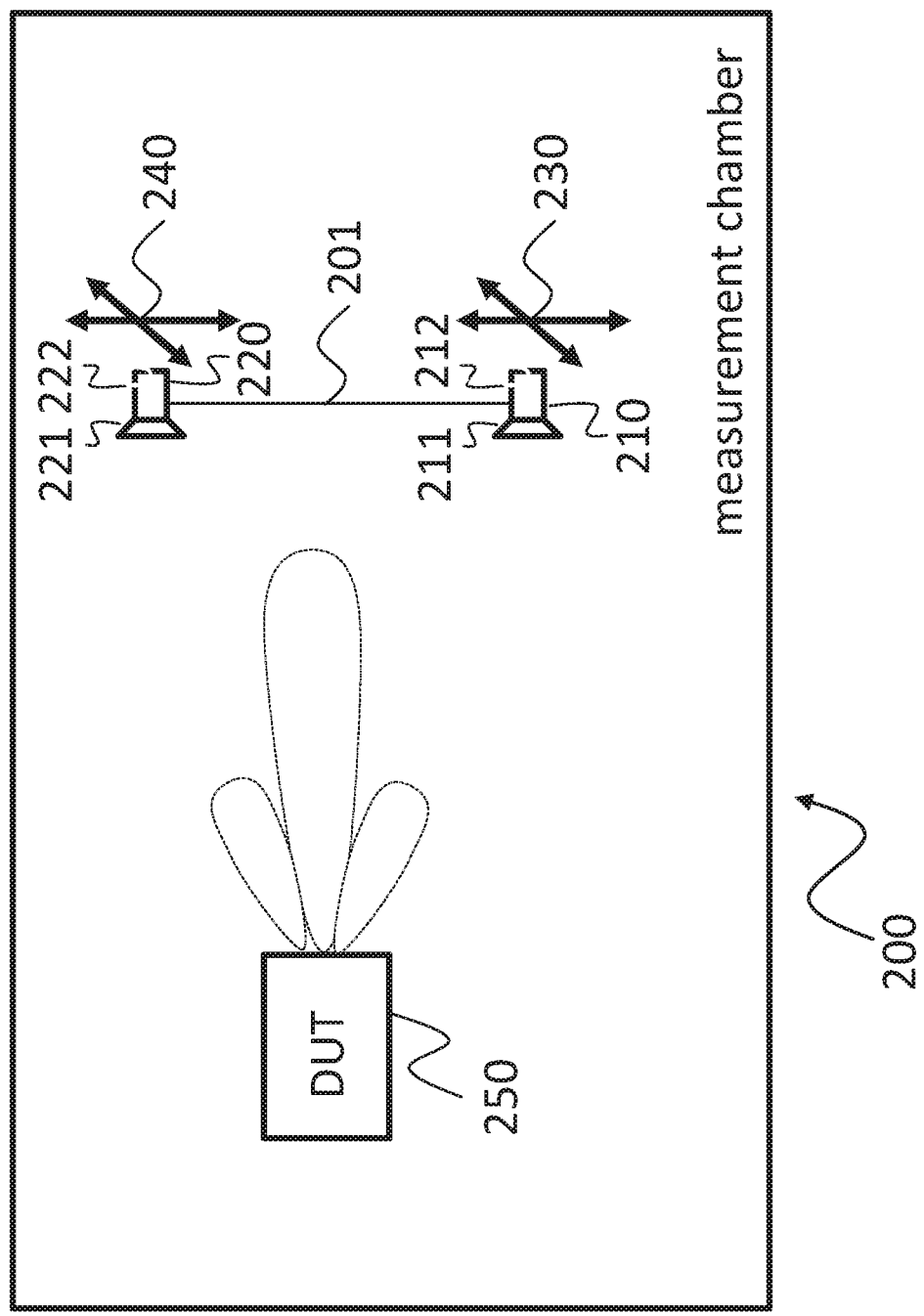
FIG. 2 shows a block diagram of another embodiment of a test arrangement according to the present invention.

FIG. 2 shows a block diagram of another test arrangement 200. The test arrangement 200 is based in the test arrangement 100. Therefore, the test arrangement 200 also comprises a first measurement device 210 with a first measurement antenna 211 and a first vectorial measurement receiver 212, a second measurement device 220 with a second measurement antenna 221 and a second vectorial measurement receiver 222, and a mechanical positioning structure 230. The first measurement device 210 and the second measurement device 220 are also communicatively coupled by link 201 for exchanging phase information, synchronising the phases of the first vectorial measurement receiver 210 and the second vectorial measurement receiver 220 or locking the phases when measuring wireless signals from the device under test 250.

In addition to the mechanical positioning structure 230 for moving of the first measurement device 210, the test arrangement 200 comprises a further mechanical positioning structure 240 for moving the second measurement device 220 with the second measurement antenna 221 and the second vectorial measurement receiver 222.

The further mechanical positioning structure 240 in FIG. 2 is similar to the mechanical positioning structure 230 for moving the first measurement device 210. Thus, the explanation of the further mechanical positioning structure 230 corresponds to the above outlined description of the mechanical processing structure 230.

Figure 3:
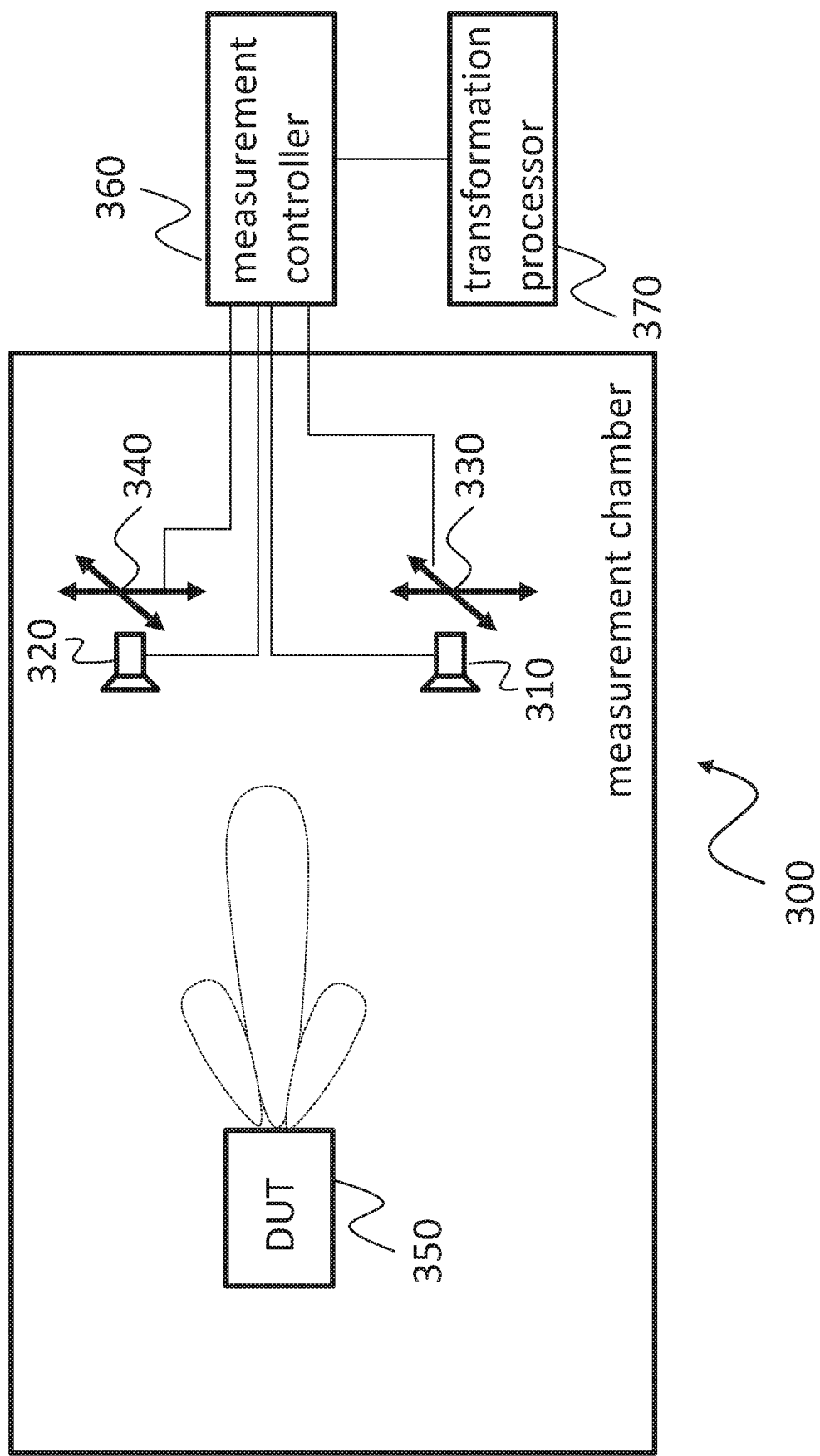
FIG. 3 shows a block diagram of another embodiment of a test arrangement according to the present invention.

FIG. 3 shows a block diagram of a test arrangement 300. The test arrangement 300 focuses on the control and measurement side and does therefore not explicitly show the mechanical arrangements as shown in FIGS. 1 and 2. It is however understood, that the below explanations and the elements of the test arrangement 300 may be combined with any element of the test arrangements 100 and 200.

The test arrangement 300 comprises a measurement controller 360. The measurement controller 360 may be communicatively coupled to the first measurement device 310 and the second measurement device 320. Accordingly, the measurement controller 360 may send commands to the measurement devices 310, 320 for setting up the measurement devices and control the operation of the measurement devices 310, 320, in particular the first and second vectorial measurement receivers.

Further the measurement controller 360 may be communicatively coupled to the mechanical positioning structures 330, 340. Accordingly, the measurement controller 360 may control the movement of the measurement devices 310, 320 which are mechanically coupled with the respective mechanical positioning structure 330, 340.

Accordingly, the measurement controller 360 is aware of the current positions of the respective first and second measurement devices 310, 320. The measurement controller 360 may further receive the output of the first and the second vectorial measurement receivers. Thus, the measurement controller 360 can assign the respective positions of the first and second measurement devices 310, 320 with the corresponding positions of the measuring devices 310, 320. In this way, the measurement controller 360 can compute a map with the characterising antenna parameters of the device under test 350. Accordingly, the measurements and/or the computed characterising parameters may be stored in memory of the measurement controller 360. In particular, the respective data may be stored in association with the corresponding positions of the first and second measurement devices 310, 320.

Furthermore, the test arrangement 300 may comprise transformation processor 370. The transformation processor may refer to the acquired measurement data, in particular to measurement data which are acquired under near-field-conditions of the device under test 350. Based on these near-field-data, the transformation processor 370 may perform a near-field to far-field transformation of the data provided by the measurement devices 310, 320 and/or the processed data which are provided by measurement controller 360.

The test arrangement 300 further comprises an anechoic chamber. The anechoic chamber comprises absorbing elements. The absorbing elements absorb or deflect the wireless signal and therefore prevent reflections of wireless signals. The anechoic chamber may e.g. comprise an opening or a door that allows inserting and removing the device under test 350.

It is understood, that measurement controller 360, the transformation processor 370 as the first and second vectorial receivers may be implemented as hardware, software or any combination of hardware and software. Such a device may e.g. comprise a processor that comprises D/A converters and A/D converters or is coupled to D/A converters and A/D converters for sending and receiving wireless signals. Further, such a processor may comprise digital I/O ports or pins or a digital bus interface that may serve to communicate with the mechanical positioning structures 330, 340.

For sake of clarity in the following description of the method based FIG. 4 the reference signs used above in the description of apparatus based FIGS. 1-3 will be maintained.

FIG. 4 shows a flow diagram of a test method for wirelessly testing a device under test 150, 250, 350.

The test method comprises a step S1 of measuring first signals emitted by the device under test 150, 250, 350 by a first measurement antenna 111, 211, and a step S2 of vectorially analysing the measured first signals by a first vectorial measurement receiver 112, 212. Further the method comprises s step S3 of measuring second signals emitted by the device under test 150, 250, 350 by a second measurement antenna 121, 221, and a step S4 of vectorially analysing the measured second signals by a second vectorial measurement receiver 122, 222, wherein the first vectorial measurement receiver 112, 212 is communicatively coupled to the second vectorial measurement receiver 122, 222 for exchanging phase information, for synchronizing the phases, for phase locking between the first vectorial measurement receiver 112, 212 and the second vectorial measurement receiver 122, 222. The method further comprises a step S5 of controllably moving the first measurement antenna 111, 211 together with the first vectorial measurement receiver 112, 212 around the device under test 150, 250, 350.

In the test method, the spatial alignment between the first measurement antenna 111, 211 and the first vectorial measurement receiver 112, 212 of the first measurement device 110, 210, 310 may remain constant when the first measurement antenna 111, 211 and the first vectorial measurement receiver 112, 212 are moved.

In the test method the first measurement antenna 111, 211 may be directly connected to the first vectorial measurement receiver 112, 212 of the first measurement device 110, 210, 310.

In the test method the first measurement antenna 111, 211 and the first vectorial measurement receiver 112, 212 of the first measurement device 110, 210, 310 may be arranged on a same printed circuit board.

The test method may further comprise a step of controllably moving the second measurement antenna 121, 221 together with the second vectorial measurement receiver 122, 222 around the device under test 150, 250, 350.

The test method may further comprise the step of moving the first measurement antenna 111, 211 and the first vectorial measurement receiver 112, 212 around the device under test 150, 250, 350 on a predetermined measurement area.

In the test method, the second measurement antenna 121, 221 and the second vectorial measurement receiver 122, 222 may be located outside the predetermined measurement area.

In the test method, the first measurement antenna 111, 211 and the second measurement antenna 121, 221 are arranged in a near-field distance of the device under test 150, 250, 350.

The test method may further comprise a step of performing a near-field to far-field transformation based on the signals received from the device under test 150, 250, 350 and outputting respective transformed signals, especially with a transformation processor 370.

The test method may further comprise a step of accommodating the first measurement antenna 111, 211, the first vectorial measurement receiver 112, 212, the second measurement antenna 121, 221, the second vectorial measurement receiver 122, 222 and the device under test 150, 250, 350 in a measurement chamber.

Summarizing, the present invention relates to a test arrangement in the test method for acquiring test data in the surrounding of a device under test. At least two measurement devices are arranged in the surrounding of the device under test, wherein the two measurement devices are communicatively coupled for phase locking. At least one of the measurement devices can be moved around the device under test for acquiring measurement data. The measurement devices comprise a measurement antenna and the vectorial measurement receiver. Accordingly, during the measurements, the at least one vectorial measurement receiver is moved around together with the measurement antenna, wherein the spatial relationship between the measurement antenna and the vectorial measurement receiver is remained constant during the movement.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS

| | |
|---|---|
| 100, 200, 300 | test arrangement |
| 101, 201 | communication link |
| 110, 210, 310 | first test device |
| 111, 211 | first measurement antenna |
| 112, 212 | first vectorial measure receiver |
| 120, 220, 320 | second test device |
| 121, 221 | second measurement antenna |
| 122, 222 | second vectorial measure receiver |
| 130, 230, 330 | mechanical positioning structure |
| 140, 240, 340 | further mechanical positioning structure |
| 150, 250, 350 | device under test, antenna under test |
| 360 | measurement controller |
| 370 | transformation processor |
| S1, S2, S3, S4, S5 | method steps |

The invention claimed is:

1. A test arrangement for testing a device under test, the test arrangement comprising:
   a first measurement device comprising a first measurement antenna for measuring first signals emitted by the device under test and a first vectorial measurement receiver for vectorially analysing the measured first signals;
   a second measurement device comprising a second measurement antenna for measuring second signals emitted by the antenna under test and a second vectorial measurement receiver for vectorially analysing the measured second signals, wherein the second measurement device is communicatively coupled to the first measurement device for exchanging phase information or phase synchronisation or phase locking; and
   a mechanical positioning structure that carries the first measurement device and controllably moves the first measurement antenna and the first vectorial measurement receiver of the first measurement device around the device under test.

2. The test arrangement of claim 1, wherein the spatial alignment between the first measurement antenna and the first vectorial measurement receiver of the first measurement device remains constant when the first measurement device is moved by the mechanical positioning structure.

3. The test arrangement of claim 1, wherein the first measurement antenna is directly connected to the first vectorial measurement receiver of the first measurement device.

4. The test arrangement of claim 1, wherein the first measurement antenna and the first vectorial measurement receiver of the first measurement device are arranged on a same printed circuit board.

5. The test arrangement of claim 1, comprising a further the mechanical positioning structure that carries the second measurement device and controllably moves the second measurement antenna and the second vectorial measurement receiver of the second measurement device around the device under test.

6. The test arrangement according to claim 1, wherein the mechanical positioning structure moves the first measurement device around the device under test on a predetermined measurement area.

7. The test arrangement of claim 6, wherein the second measurement device is located outside the predetermined measurement area.

8. The test arrangement of claim 1, wherein the first measurement device and the second measurement device are arranged in a near-field distance of the device under test.

9. The test arrangement of claim 8, comprising a transformation processor that is coupled to the first measurement device and the second measurement device and performs a near-field to far-field transformation based on the signals received from the device under test and outputs respective transformed signals.

10. The test arrangement of claim 1, comprising a measurement chamber that accommodates the first measurement device, the second measurement device, the mechanical positioning structure and the device under test.

11. A test method for testing a device under test, the test method comprising:
- measuring, by a first measurement antenna, first signals emitted by the device under test;
- vectorially analysing the measured first signals by a first vectorial measurement receiver;
- measuring, by a second measurement antenna, second signals emitted by the device under test;
- vectorially analysing the measured second signals by a second vectorial measurement receiver, wherein the vectorial measurement receiver is communicatively coupled to the first vectorial measurement receiver for exchanging phase information or phase synchronisation or phase locking; and
- controllably moving the first measurement antenna together with the first vectorial measurement receiver around the device under test by a mechanical positioning structure.

12. The test method of claim 11, wherein the spatial alignment between the first measurement antenna and the first vectorial measurement receiver of the first measurement device is kept constant when the first measurement antenna and the first vectorial measurement receiver are moved.

13. The test method of claim 11, wherein the first measurement antenna is directly connected to the first vectorial measurement receiver of the first measurement device.

14. The test method of claim 11, wherein the first measurement antenna and the first vectorial measurement receiver of the first measurement device are arranged on a same printed circuit board.

15. The test arrangement of claim 11, comprising controllably moving the second measurement antenna together with the second vectorial measurement receiver around the device under test.

16. The test method according to claim 11, comprising moving the first measurement antenna and the first vectorial measurement receiver around the device under test on a predetermined measurement area.

17. The test method of claim 16, wherein the second measurement antenna and the second vectorial measurement receiver are located outside the predetermined measurement area.

18. The test method of claim 11, wherein the first measurement antenna and the second measurement antenna are arranged in a near-field distance of the device under test.

19. The test method of claim 11, comprising performing a near-field to far-field transformation based on the signals received from the device under test and outputting respective transformed signals.

20. The test method of claim 11, comprising accommodating the first measurement antenna, the first vectorial measurement receiver, the second measurement antenna, the second vectorial measurement receiver, the mechanical positioning structure and the device under test in a measurement chamber.

* * * * *